(12) United States Patent
Xiang et al.

(10) Patent No.: US 6,323,093 B1
(45) Date of Patent: Nov. 27, 2001

(54) PROCESS FOR FABRICATING A SEMICONDUCTOR DEVICE COMPONENT BY OXIDIZING A SILICON HARD MASK

(75) Inventors: Qi Xiang, Santa Clara; Scott Allan Bell; Chih-Yuh Yang, both of San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/290,088

(22) Filed: Apr. 12, 1999

(51) Int. Cl.[7] ................................. H01L 21/336
(52) U.S. Cl. ................. 438/299; 438/301; 438/585; 438/740
(58) Field of Search ................................ 438/299, 301, 438/303, 305, 306, 585, 595, 740, 742, 947, 795

(56) References Cited

U.S. PATENT DOCUMENTS 5,837,588 * 11/1998 Wu ........................... 438/305
6,046,090 * 4/2000 Wu ........................... 438/303

OTHER PUBLICATIONS

Nulman, J., "In–Situ Processing of Silicon Dielectrics by Rapid Thermal Processing: Cleaning, Growth, and Annealing", Rapid Thermal Processing of Electronic Materials, Materials Research Society, 1987, pp. 141–146.*

Flowers, D.L., "Rapid Thermal Proceesing of Gate Dielectric Films and Their Characterization", Rapid Thermal Processing of Electronic Materials, Materials Research Society, 1987, pp. 127–132.*

Wolf, S., et al., Silicon Processing for the VLSI ERa, vol. 1, Lattice Press, 1986, pp. 56–58, 207–210.*

Wolf, S., et al., Silicon Processing for the VLSI Era, vol. 1, Lattice Press, 2000, pp. 303–323.*

Van Zant, P., Microchip Fabrication, McGraw–Hill, 1997, pp. 166–170.

* cited by examiner

Primary Examiner—T. N. Quach
(74) Attorney, Agent, or Firm—Eschweiler & Associates, LLC

(57) ABSTRACT

A process for fabricating a semiconductor device includes the formation of a hard-mask using lithographic techniques, followed by an oxidation process to reduce the lateral dimension of the hard-mask. The oxidation process is carried out by selectively oxidizing an oxidizable layer overlying an etch-stop layer. Upon completion of the oxidation process, the etch-stop layer is removed and a residual layer of oxidizable material is then used as a mask for the formation of a device component. The lateral dimension of the residual layer can be substantially less than that achievable by optical lithographic techniques.

18 Claims, 4 Drawing Sheets

PROCESS FOR FABRICATING A SEMICONDUCTOR DEVICE COMPONENT BY OXIDIZING A SILICON HARD MASK

REFERENCE TO RELATED APPLICATIONS

Related subject matter is disclosed in the following commonly-assigned, co-pending patent applications filed on even date herewith:

REFERENCE TO RELATED APPLICATIONS
Related subject matter is disclosed in the following commonly-assigned, co-pending patent applications filed on even date herewith:

| TITLE | SER. NO. | PATENT NO. |
| --- | --- | --- |
| PROCESS FOR FABRICATING A SEMICONDUCTOR DEVICE COMPONENT USING LATERAL METAL OXIDATION | 09/290,555 | 6,214,683 |
| PROCESS FOR FABRICATING A SEMICONDUCTOR DEVICE COMPONENT USING A SELECTIVE SILICIDATION REACTION | 09/290,087 | 6,211,044 |
| PROCESS FOR FABRICATING A METAL SEMICONDUCTOR DEVICE COMPONENT BY LATERAL OXIDATION | 09/290,086 | 6,287,918 |

FIELD OF THE INVENTION

This invention relates, in general, to semiconductor device fabrication, and more particularly, to the fabrication of MOS transistors having sub-micron dimensions.

BACKGROUND OF THE INVENTION

There is a continuing trend in the semiconductor industry to fabricate integrated circuits of increasing complexity. As the complexity of an integrated circuit increases, the cost associated with fabricating the integrated circuit also increase. In order to provide integrated circuit devices having increased functional capability, while maintaining control over the cost associated with fabrication, more devices must be included on each semiconductor wafer. In recent years, integrated circuit fabrication technology has achieved the ability to define circuit components having feature sizes in the sub-microns size range. For example, new lithographic techniques have been developed using x-ray and deep UV energy sources. Additionally, film deposition technology now exist that can form thin-films having a precisely determined metallurgical composition and thickness. Furthermore, thin-film etching techniques have been developed which are capable of selectively etching one metallurgical composition, while not substantially etching other metallurgical compositions present on the semiconductor substrate.

However, even with the marked advances in fabrication technology, achievement of the necessary packing density and cost control in the manufacture of modern integrated circuits requires further processing innovations. This is because as device dimensions, such as the length of gate electrodes in metal-oxide-semiconductor (MOS) transistors, continue to be scaled to smaller dimensions new physical process limitations arise.

One major impediment to further size reduction of MOS transistors relates to the physical limitation of lithographic technology. Photolithographic techniques utilize an optically sensitive resist material that is formed on a semiconductor substrate. A photolithographic mask having a predetermined pattern is aligned to the semiconductor wafer and light is passed through the mask. After exposing the resist, the resist is developed to form a pattern on the wafer. The photoresist exposure steps typically require a difficult alignment of the mask with the wafer. In addition to alignment difficulty, the smallest feature size that can be photolithographically defined is limited by optical defraction. To reduce the amount of defraction in lithographic operations, manufacturers have resorted to the use of deep UV lithographic techniques to overcome some of the diffraction problems encountered using higher wave lengths of light. However, even deep UV lithography is not able to reliably define feature sizes of 0.1 microns and smaller.

To further enhance the performance of lithographic technology, manufacturers have developed advanced resist materials and coatings, such as antireflective coatings, and the like, to improve the ability of optical lithography to produce sub-micron features. Additionally, post-feature definition methods, such as photoresist trimming, are also used to reduce the feature size to dimensions below the photolithographic limit. Although advances in resist materials and processing methods have extended the limit of lithography to smaller dimensions, the precise formation of extremely small feature sizes remains beyond the ability of present process technology.

The fabrication of MOS transistors to have gate electrodes on the order of 0.1 microns requires processing technology beyond existing lithographic and resist formulation technologies. In many ways, the smallest feature size to which an MOS gate electrode can be fabricated governs the scaling of all other device components in an integrated circuit. The feature size of an MOS gate electrode must be continuously scaled down to improve the performance and operational capabilities of an integrated circuit. Accordingly, an improved fabrication process is necessary to reliably manufacture device components, such as MOS transistors having gate lengths on the order of 0.1 microns and smaller.

SUMMARY OF THE INVENTION

The present invention is for a process of fabricating a semiconductor device having feature sizes that are independent of lithographic limitations. In one embodiment, the process of the invention is advantageously used to fabricate the gate electrode of an MOS transistor. The lateral dimensions of the MOS gate electrode are initially defined by a lithographic process. However, the final lateral dimensions of the gate electrode are defined by oxidizing portions of a hard-mask overlying the gate-forming layer. Once the oxidized portions are removed, the remaining unoxidized portion becomes the masking layer for the formation of the gate electrode. The process of the invention advantageously enables features on semiconductor devices to be fabricated to extremely small lateral dimensions, regardless of the capability of the lithographic system.

In one form, a semiconductor substrate is provided having a device component layer thereon. An etch-stop layer is formed to overlie the device component layer, and an oxidizable layer is formed to overlie the etch-stop layer. The oxidizable layer is processed to form a hard-mask having a first length. Then, the hard-mask is oxidized to form a hard-mask having a second length, wherein the second length is less than the first length. The device component layer is then processed by removing portions of the device component layer exposed by the hard-mask.

Figure 1:
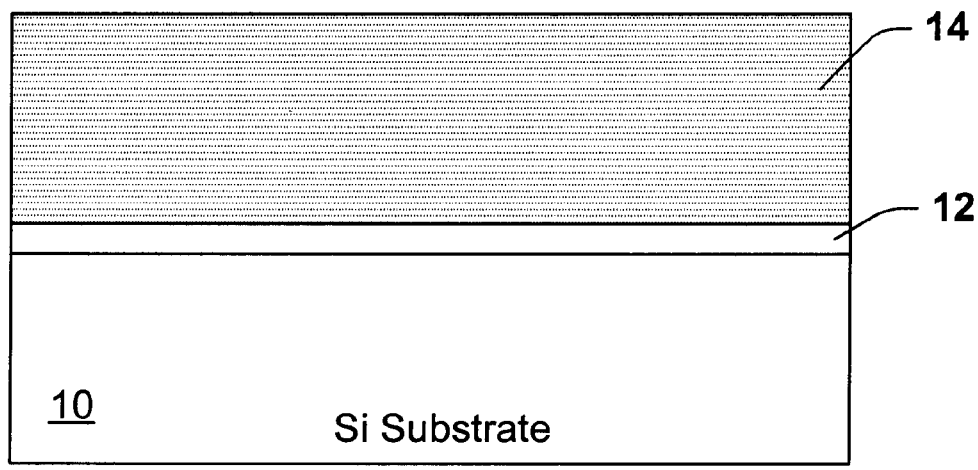
FIGS. 1–8 illustrate processing steps in accordance with the invention.

It will be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF PREFERRED EMBODIMENTS

FIGS. 1–8 illustrate processing steps in accordance with the invention for the fabrication of an MOS gate electrode. Although the illustrative embodiment of the invention is described with respect to the fabrication of an MOS gate electrode, those skilled in the art will appreciate that the process of the invention can be used to fabricate a wide variety of device components. For example, the process of the invention can be used to fabricate components, such as electrical leads, thin-film resistors, capacitors, and the like. Accordingly, the present invention contemplates the fabrication of all such device components and is not merely limited to the fabrication of MOS gate electrodes.

Shown in FIG. 1, in cross-section is a portion of a semiconductor substrate 10 having already undergone several processing steps in accordance with the invention. A gate dielectric layer 12 overlies an upper surface of semiconductor substrate 10. A gate layer 14 overlies gate dielectric layer 12. In the present embodiment, gate layer 12 is a material capable of forming a semiconductor gate electrode. Additionally, semiconductor substrate 12 is a substrate material capable of supporting an MOS transistor. Preferably, gate layer 14 is polycrystalline silicon or amorphous silicon conventionally deposited by chemical-vapor-deposition (CVD), and semiconductor substrate 10 is either single crystal silicon or epitaxial silicon, and gate dielectric layer 12 is silicon dioxide thermally grown on the surface of semiconductor substrate 10. Depending upon the particular type of MOS transistor to be fabricated, gate layer 14 can be doped with a conductivity determining dopant. Further, those skilled in the art will appreciate that gate layer 14 can be another material, such as a refractory metal, a refractory metal silicide, and the like. Additionally, semiconductor substrate 10 can be doped to have either a p-type or an n-type conductivity depending upon the particular conductivity of the MOS transistor being fabricated. Typical n-type dopants include phosphorus, arsenic, antimony, and the like, and typical p-type dopants include boron, and the like.

Figure 2:
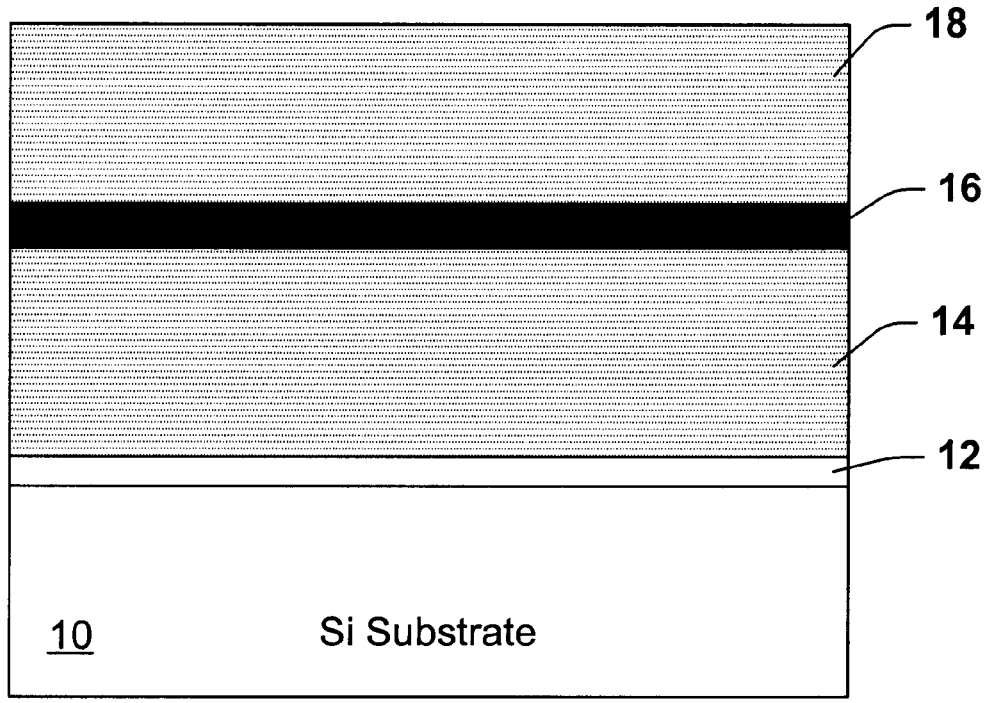

The inventive process continues, as illustrated in FIG. 2, with the formation of an etch-stop layer 16 overlying gate layer 14. An oxidizable layer 18 is formed to overlie etch-stop layer 16. Preferably, etch-stop layer 16 is a material that is differentially etchable with respect to oxidizable layer 18. In one embodiment, etch-stop layer 16 is silicon nitride and oxidizable layer 18 is a semiconductor material, such as polycrystalline silicon, amorphous silicon, and the like. In a preferred embodiment of the invention, oxidizable layer 18 is polycrystalline silicon formed by either CVD or by physical-vapor-deposition (PVD) to a thickness of about 1000 to 2000 angstroms, and etch-stop layer 16 is silicon nitride formed to a thickness of about 500 to 1000 angstroms.

Figure 3:
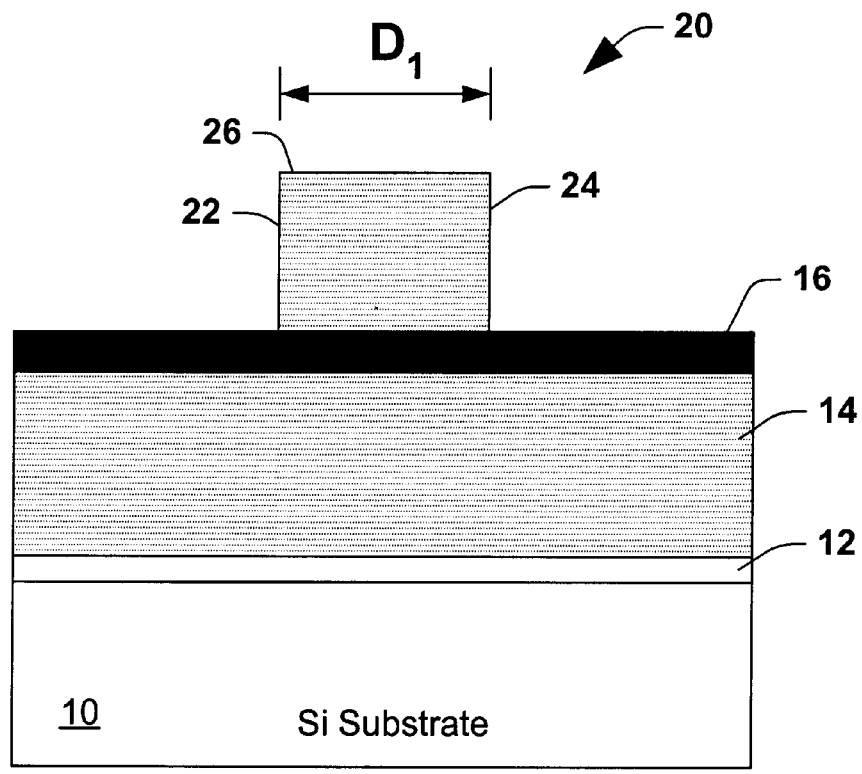

As illustrated in FIG. 3, oxidizable layer 18 is processed to form a hard-mask 20. In one embodiment, hard-mask 20 is formed by a conventional lithographic process in which a resist layer (not shown) is deposited to overlie oxidizable layer 18, and lithographic processing is carried out to define a pattern having a lateral dimension ($D_1$). Preferably a reactive-ion-etch (RIE) process is used to anisotropically etch oxidizable layer 18. Following the etching process and removal of the lithographic mask, hard-mask 20 is formed to have a first edge 22 and a second edge 24 opposite first edge 22. A top surface 26 extends between first edge 22 and second edge 24.

Figure 4:
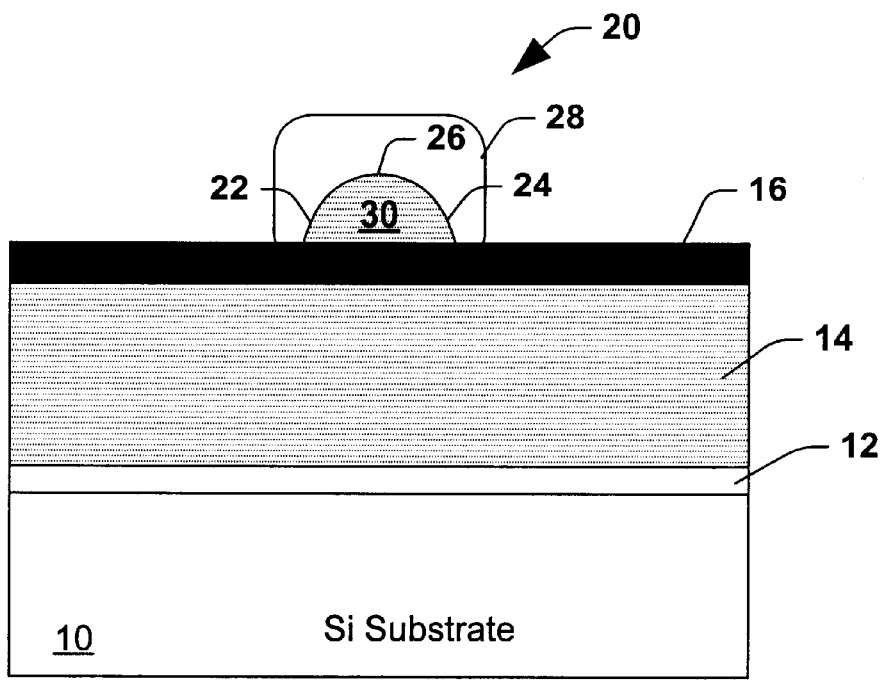

After forming hard-mask 20, and oxidation process is carried out to oxidize first and second edges 22 and 24 and top surface 26, as illustrated in FIG. 4. The oxidation process forms an oxide layer 28. The oxidation process causes first and second edges 22 and 24 and top surface 26 to recede as the material of oxidizable layer 18 is converted to an oxide. Upon completion of the oxidation process, a residual layer 30 of unoxidized material remains overlying etch-stop layer 16. Etch-stop layer 16 prevents the oxidation of the lower portion of residual layer 30. As described below, the oxidation process advantageously reduces the lateral distance between first and second edges 22 and 24.

In a preferred embodiment of the invention, where oxidizable layer 18 is polycrystaline silicon, the oxidation process is carried out in an oxygen ambient at an elevated temperature. The oxidation process can be performed either by thermal oxidation or by rapid-thermal-annealing (RTA). Preferably, the oxidation process is carried out at a temperature of about 700 to 1000° C. The oxidation time will depend upon factors, such as the particular metallurgical composition of oxidizable layer 18, the type of oxidation process used, the temperature, and the like. Importantly, the oxidation time will depend upon the final lateral distance desired between first and second edges 22 and 24 and the initial thickness of oxidizable layer 18.

Figure 5:
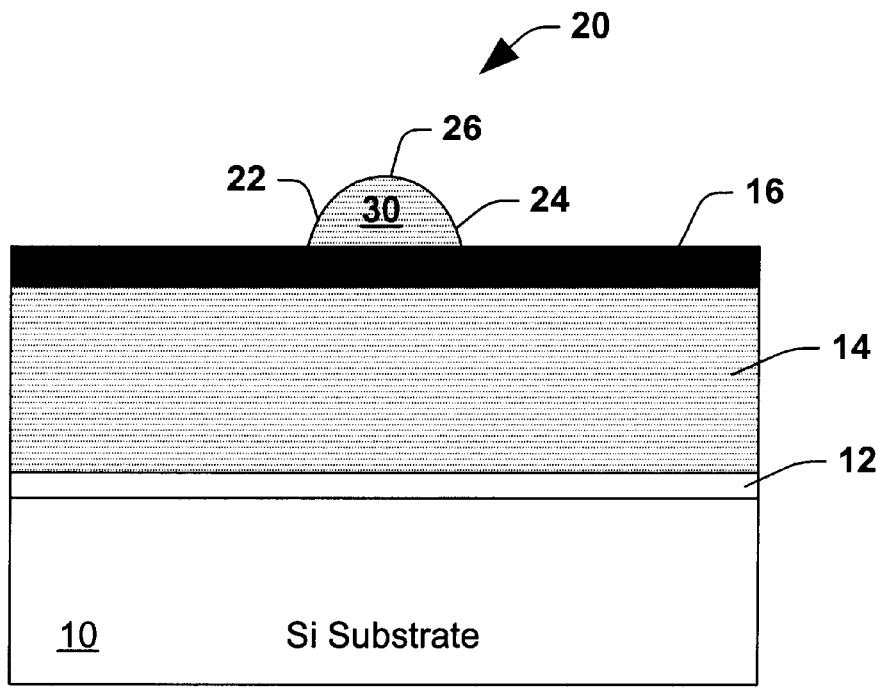

In accordance with the invention, oxide layer 28 is removed, as illustrated in FIG. 5. Preferably, oxide layer 28 is isotropically etched by a selective wet etching process. The etching process substantially removes oxide layer 28, while not substantially etching etch-stop layer 16 or residual layer 30. In an alternative processing method, oxide layer 28 can be removed by a dry isotropic etching process. In a preferred embodiment, where oxidizable layer 18 is polycrystaline silicon, a dilute hydrofluoric acid solution is used to selective remove oxide layer 28, while not substantially etching etch-stop layer 16 or residual layer 30.

Figure 6:
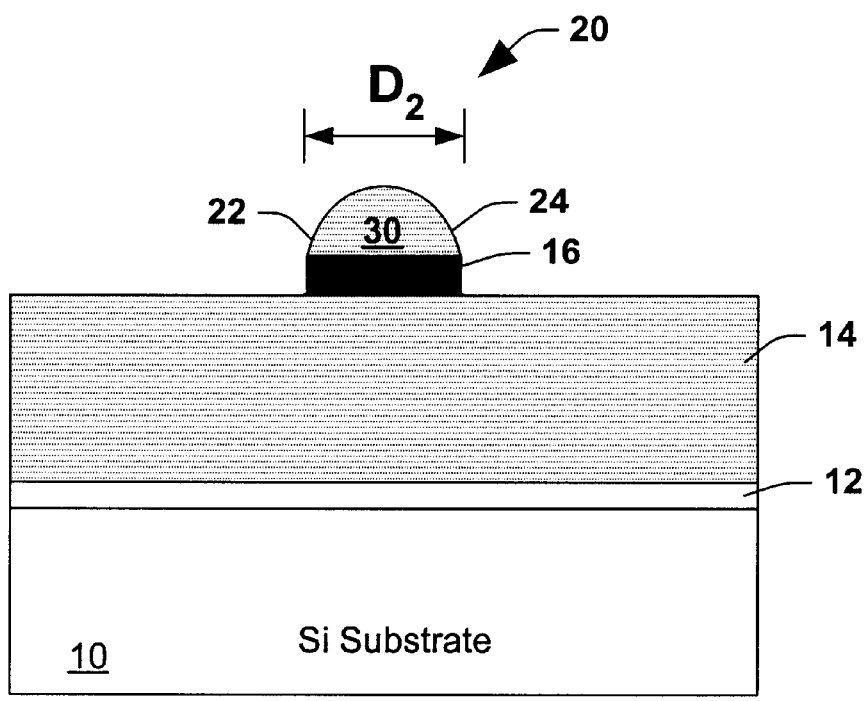

Once oxide layer 28 is removed, portions of etch-stop layer 16 exposed by residual layer 30 are also removed, as illustrated in FIG. 6. Preferably, etching is carried out by means of an RIE process in which exposed portions of etch-stop layer 16 are anisotropically etched away. The anisotropic etching process is selective to etch-stop layer 16 and does not substantially etch either residual layer 30 or gate layer 14. In a preferred embodiment of the invention, where residual layer 30 is polycrystaline silicon and etch-stop layer 16 is silicon nitride, fluorinated hydrocarbon etching chemistry is used to selectively etch away exposed portions of etch-stop layer 16.

Upon completion of the etching process, hard-mask 20 has a lateral dimension ($D_2$). The lateral distance $D_2$ between first and second edges 22 and 24 is substantially less than the lateral dimension $D_1$ originally defined by a lithographic process. The inventive process has advantageously reduced the lateral dimension of hard-mask 20 from a lithographically defined lateral dimension $D_1$ to a substantially smaller lateral dimension $D_2$. It is important to note that the reduced lateral dimension $D_2$ has been achieve without the used of a lithographic alignment process. In accordance with the invention, the dimension $D_2$ can be defined to values of about 0.1 microns and smaller. The ultimate dimension achievable by the process of the invention is only limited by the oxidation characteristics and the control of deposition thickness of oxidizable layer 18. Those skilled in the art will appreciate that in many processing technologies the deposition thickness of thin-film materials can be controlled to high precision, while lithographic processes at 0.1 microns can only be controlled with great difficulty. Thus, the inventive process has provided a hard-mask 20 having a dimension $D_2$ that is substantially less than the dimensions achievable by optical lithographic techniques.

Figure 7:
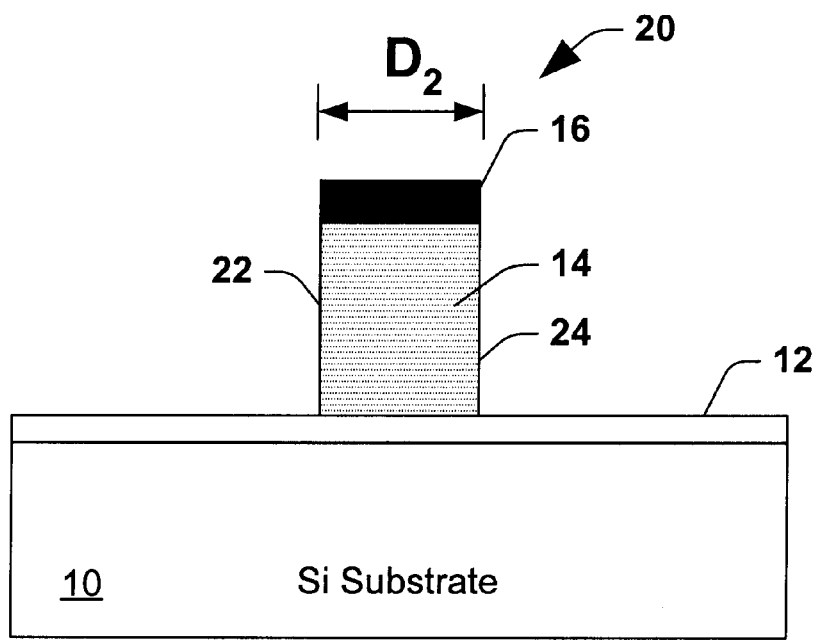

Referring to FIG. 7, once hard-mask 20 is fabricated to have lateral dimension $D_2$, gate layer 14 is anisotropically etched using hard-mask 20 as an etch mask. The etching process selectively removes exposed portions of gate layer 14, while not substantially etching gate dielectric layer 12. In a preferred embodiment of the invention, where gate layer 14 is polycrystalline silicon and gate dielectric layer 12 is silicon dioxide, chlorinated etching chemistry is used to selectively etch gate layer 14. The anisotropic etching process transfers the dimension $D_2$ from hard-mask 20 to gate layer 14. The RIE process is preferably carried out at low pressure and relatively high power. The RIE process can be carried out in a diode-type etching apparatus, or alternatively, in a magnetically enhanced RIE apparatus.

Figure 8:
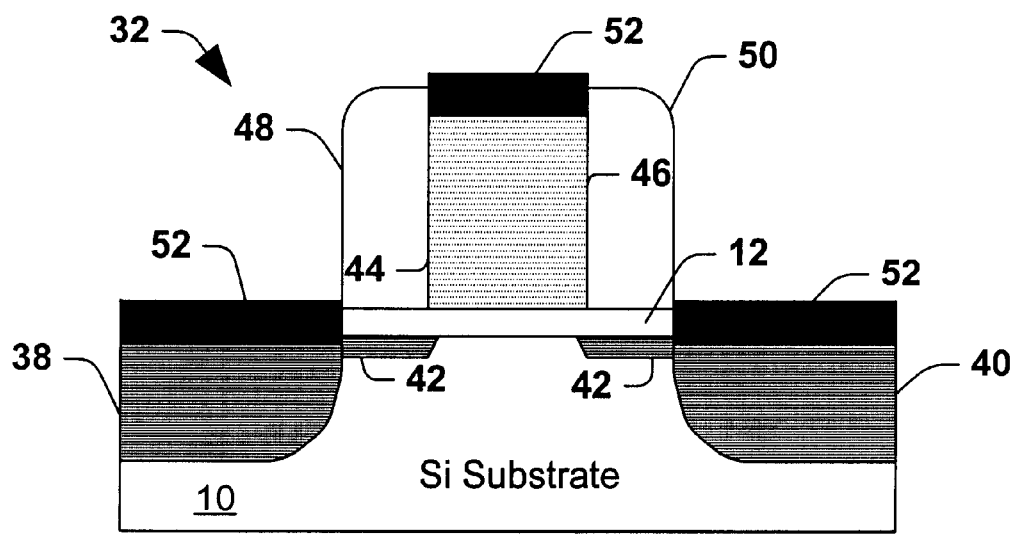

After fabricating gate layer 14 to a lateral dimension of $D_2$, subsequent processing is carried out to complete the fabrication of an MOS transistor 32. As illustrated in FIG. 8, source and drain regions 38 and 40 are formed in substrate 10. Additionally, source/drain extension regions 42 are also formed in substrate 10 and extend from source and drain regions 38 and 40 to the vicinity of first and second edges 44 and 46 of gate layer 14. Sidewall spacers 48 and 50 are formed overlying first and second edges 44 and 46, respectively. After forming sidewall spacers 48 and 50, silicide contact regions 52 are formed overlying source on drain regions 38 and 40 and gate layer 14. Those skilled in the art will recognize that MOS transistor 32 incorporates many components typically found in sub-micron MOS transistors. Additionally, MOS transistor 32 can be either an n-type or a p-type depending on the conductivity of the dopants used to form source and drain regions 38 and 40 and source/drain extension regions 42. As described above, gate layer 14 can be a material dope with either p-type or n-type dopants. Further, gate layer 14 can be one of a number of gate-forming materials.

Thus, it is apparent that there has been disclosed a process for fabricating a semiconductor device component by oxidizing a hard-mask that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, various thin-film deposition techniques, such as molecular beam deposition, metal-organic CVD, and the like, can be used. It is therefore intended to include within the invention all such variations and modifications as fall within the scope of the appended claims and equivalents thereof.

What is claimed is:

1. A process for fabricating a semiconductor device comprising the steps of:

providing a semiconductor substrate having a gate layer overlying the semiconductor substrate and separated therefrom by a gate dielectric layer;

forming an etch-stop layer overlying the gate layer;

forming a first mask of oxidizable silicon material overlying the gate layer,
wherein the first mask has a first length;

oxidizing the first mask to form a second mask having a second length,
wherein the second length is less than the first length, and
wherein the second length is no more than about 0.1 microns; and removing portions of the etch-stop layer and the gate layer exposed by the second mask,
wherein the step of oxidizing the first mask comprises rapid thermal annealing in an oxidizing ambient.

2. The process of claim 1, wherein the step of forming first mask of oxidizable silicon material comprises forming a body of oxidizable silicon material having first and second opposed edges and a top surface, and wherein the step of oxidizing the mask comprises forming an oxide layer overlying the first and second opposed edges and the top surface.

3. The process of claim 2, further comprising the step of isotropically etching away the oxide layer.

4. The process of claim 2, wherein the step of oxidizing the mask comprises thermal oxidation at a temperature of about 700 to 1000° C.

5. The process of claim 1, wherein the step of removing portions of the etch-stop layer and the gate layer comprises reactive ion etching.

6. The process of claim 1, wherein the step of providing a gate layer comprises forming a layer selected from the group consisting of polycrystalline silicon and amorphous silicon.

7. The process of claim 1, wherein the step of forming an etch-stop layer comprises forming a silicon nitride layer.

8. The process of claim 1, wherein the step of forming a first mask of oxidizable silicon material comprises the steps of:

forming a layer of oxidizable silicon material overlying the etch-stop layer;

forming a lithographic masking pattern on the layer of oxidizable silicon material; and anisotropically etching the layer of oxidizable silicon material.

9. A process for fabricating a semiconductor device comprising the steps of:

providing a semiconductor substrate having a device component layer thereon;

forming an etch-stop layer overlying the device component layer;

forming an oxidizable layer overlying the etch-stop layer;

etching the oxidizable layer to form a first hard-mask having a first length;

oxidizing the first hard-mask to form a second hard-mask having a second length,
wherein the second length is less than the first length, and
wherein the second length is no more than about 0.1 microns; and etching the etch-stop layer and the device component layer using the second hard-mask as an etching mask, to form a device feature having substantially the same dimension as the second length, wherein the step of oxidizing the first hard-mask comprises rapid thermal annealing in an oxidizing ambient.

10. The process of claim 9, wherein the step of etching to form a hard-mask comprises forming a forming a hard-mask having first and second opposed edges and a top surface, and wherein the step of oxidizing the hard-mask comprises oxidizing the first and second opposed edges and a top surface to form an oxide layer thereon.

11. The process of claim 10, further comprising the step of isotropically etching away the oxide layer.

12. The process of claim 9, wherein the step of forming an oxidizable layer comprises forming a layer of material selected from the group consisting of polycrystalline silicon and amorphous silicon.

13. A process for fabricating a semiconductor device comprising the steps of:

providing a semiconductor substrate having a device component layer thereon;

forming a hard-mask on the device component layer,
wherein the hard-mask has a top surface and first and second edges,
wherein the first and second edges are spaced apart by a first lateral dimension;

oxidizing a portion of the hard-mask to reduce the first lateral dimension to a second lateral dimension,
wherein the second lateral dimension is less than the first lateral dimension; and anisotropically etching the device component layer using the hard-mask to form a device component on the semiconductor substrate, the device component having substantially the second lateral dimension,
wherein the step of oxidizing a portion of the hard-mask comprises rapid thermal annealing in an oxidizing ambient.

14. The process of claim 13, wherein the step of forming a hard-mask comprises the steps of:

forming an etch-stop layer overlying the device component layer;

forming an oxidizable layer overlying the etch-stop layer; and lithographically processing the oxidation resistant layer and the oxidizable layer to form the first and second edges.

15. The process of claim 14, wherein the steps of providing a device component layer and forming an oxidizable layer comprise forming a layer selected from the group consisting of a polycrystalline silicon layer and an amorphous silicon layer.

16. The process of claim 13, wherein the step of oxidizing a portion of the hard-mask comprises forming an oxide layer overlying the first and second edge portions and the top surface.

17. The process of claim 13, wherein the step of oxidizing a portion of the hard mask comprising oxidation at about 700° C. to about 1000° C.

18. The process of claim 13, wherein the step of using the hard-mask to form a device component comprises reactive ion etching.

* * * * *

UNITED STATES PATENT AND TRADEMARK OFFICE
CERTIFICATE OF CORRECTION

PATENT NO.    : 6,323,093 B1
DATED         : November 27, 2001
INVENTOR(S)   : Qi Xiang, Scott Allan Bell and Chih-Yuh Yang It is certified that error appears in the above-identified patent and that said Letters Patent is hereby corrected as shown below:

<u>Column 7,</u>
Line 5, please delete the words "a forming".

Signed and Sealed this

Seventh Day of May 2002

Attest:

Attesting Officer

JAMES E. ROGAN
Director of the United States Patent and Trademark Office